(12) United States Patent
Fuse et al.

(10) Patent No.: US 9,023,720 B2
(45) Date of Patent: May 5, 2015

(54) MANUFACTURING METHOD OF SEMICONDUCTOR DEVICE

(75) Inventors: Genshu Fuse, Tokyo (JP); Michiro Sugitani, Tokyo (JP)

(73) Assignee: Sen Corporation, Tokyo (JP)

( * ) Notice: Subject to any disclaimer, the term of this patent is extended or adjusted under 35 U.S.C. 154(b) by 478 days.

(21) Appl. No.: 13/217,679

(22) Filed: Aug. 25, 2011

(65) Prior Publication Data

US 2012/0052664 A1    Mar. 1, 2012

(30) Foreign Application Priority Data

Aug. 26, 2010    (JP) .................................. 2010-189218

(51) Int. Cl.
| | |
|---|---|
| *H01L 21/00* | (2006.01) |
| *H01L 21/04* | (2006.01) |
| *H01L 21/425* | (2006.01) |
| *H01L 21/265* | (2006.01) |
| *H01L 29/66* | (2006.01) |
| *H01L 21/223* | (2006.01) |

(52) U.S. Cl.
CPC ....... *H01L 21/26526* (2013.01); *H01L 21/2236* (2013.01); *H01L 21/26586* (2013.01); *H01L 29/66803* (2013.01)

(58) Field of Classification Search
USPC ................. 438/501, 505, 510, 514, 495, 499; 257/E21.335, E21.336, E21.334, 257/E21.345
See application file for complete search history.

(56) References Cited

U.S. PATENT DOCUMENTS

| | | | |
|---|---|---|---|
| 3,562,022 A | 2/1971 | Shifrin | |
| 6,236,085 B1 * | 5/2001 | Kawaguchi et al. | .......... 257/345 |
| 7,524,743 B2 | 4/2009 | Gupta et al. | |
| 2007/0084564 A1 | 4/2007 | Gupta et al. | |
| 2007/0087574 A1 | 4/2007 | Gupta et al. | |

FOREIGN PATENT DOCUMENTS

| | | |
|---|---|---|
| EP | 2 330 614 A2 | 6/2011 |
| JP | S54-019648 A | 2/1979 |
| JP | S61176045 A | 8/1986 |
| JP | H02-165637 A | 6/1990 |
| JP | 2001332207 A | 11/2001 |

(Continued)

OTHER PUBLICATIONS

Japanese Office Action dated Jan. 22, 2014 issued in corresponding JP 2010-189218, with English translation of the relevant part of the Office Action.

(Continued)

*Primary Examiner* — Mohsen Ahmadi
(74) *Attorney, Agent, or Firm* — Arent Fox LLP

(57) ABSTRACT

After formation of a silicon Fin part on a silicon substrate, a thin film including an impurity atom which becomes a donor or an acceptor is formed so that a thickness of the thin film formed on the surface of an upper flat portion of the silicon Fin part becomes large relative to a thickness of the thin film formed to the surface of side wall portions of the silicon Fin part. A first diagonal ion implantation from a diagonal upper direction to the thin film is performed and subsequently a second diagonal ion implantation is performed from an opposite diagonal upper direction to the thin film. Recoiling of the impurity atom from the inside of the thin film to the inside of the side wall portions and to the inside of the upper flat portion is realized by performing the first and second diagonal ion implantations.

16 Claims, 8 Drawing Sheets

(56) References Cited

FOREIGN PATENT DOCUMENTS

| | | |
|---|---|---|
| JP | 2004-022616 A | 1/2004 |
| JP | 2005150267 A | 6/2005 |
| JP | 2008-53725 A | 3/2008 |
| JP | 2009021456 A | 1/2009 |
| JP | 2011119606 A | 6/2011 |

OTHER PUBLICATIONS

Japanese Office Action, dated Aug. 20, 2014, issued in Japanese Patent Application No. 2010-189218, with English translation of the relevant part of the Office Action.

* cited by examiner

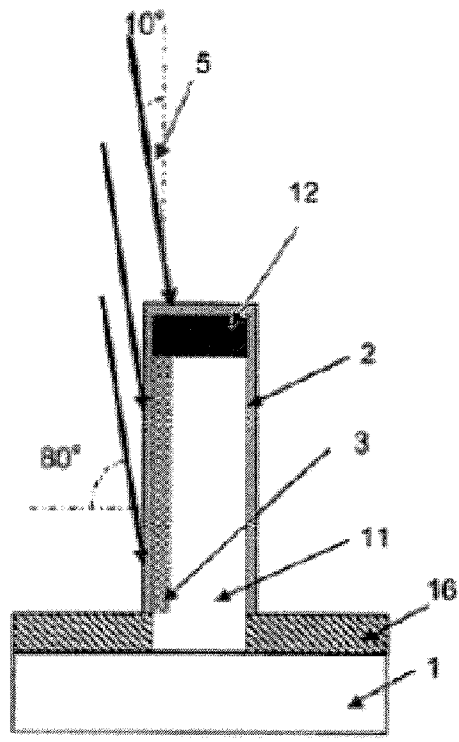
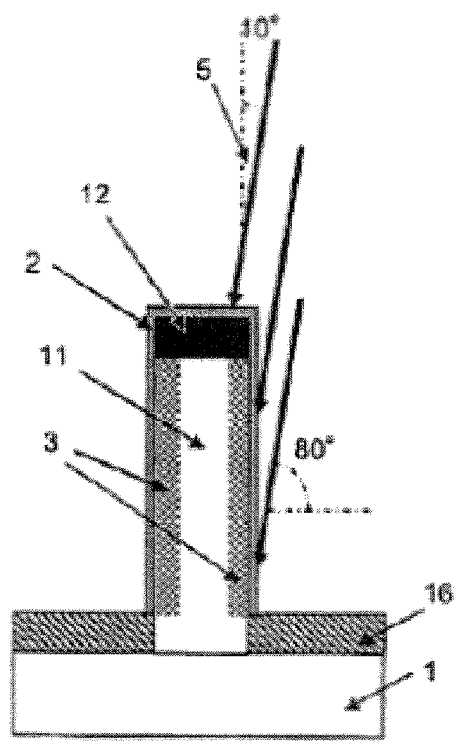
FIG. 3A
RELATED ART
FIG. 3B
RELATED ART
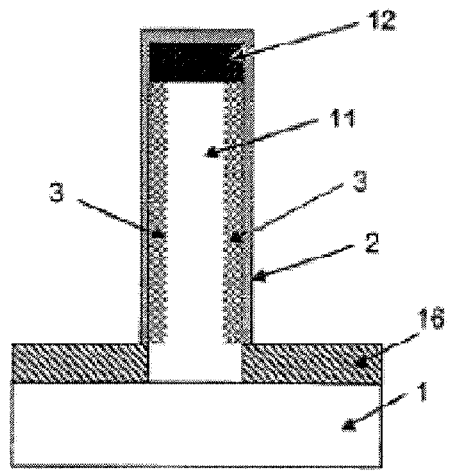
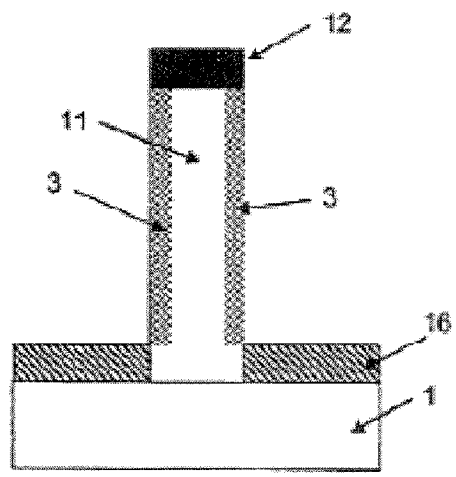
FIG. 3C
RELATED ART
FIG. 3D
RELATED ART

MANUFACTURING METHOD OF SEMICONDUCTOR DEVICE

This application is based upon and claims the benefit of priority from Japanese patent application No. 2010-189218, filed Aug. 26, 2010, the disclosure of which is incorporated herein in its entirety by reference.

BACKGROUND OF THE INVENTION

The present invention relates to a manufacturing method of a semiconductor device and, in particular, relates to a doping method of an impurity atom to a horizontal surface and vertical side walls of a cubic three-dimension device.

As an example of a cubic three-dimension device related to the present invention, a Fin (fin) type FET (Field Effect Transistor) will be described with reference to FIG. 2.

A silicon Fin part 11 of a Fin type is formed onto a silicon substrate 1. The silicon Fin part 11 is formed with a drain part D and a source part S, and a channel part is formed between the drain part D and the source part S. A gate electrode G made of polysilicon or a metal is formed through a gate insulation film 9 so as to cover the surface of the channel part between the drain part D and the source part S. In order to reduce an electric resistance, an impurity of high concentration more than $10^{20}$ cm$^{-3}$ is implanted into the drain part D and the source part S. 16 is an insulation layer.

As a method for performing doping (implanting) to vertical side walls of the drain part and the source part of a three-dimension Fin type FET, the present inventors have proposed a method shown in FIGS. 3A to 3D (however, it is still unpublished). FIGS. 3A to 3D illustrate an area shown by a dashed line in FIG. 2 with a sectional view.

In FIG. 3A, a silicon Fin part 11 is formed onto a silicon substrate 1 with an etching process by using a hard mask 12 such as SiO$_2$, SiN or the like. Next, a plane part (a plane part except for the silicon Fin part 11) of the silicon substrate 1 is covered with the insulation layer 16 made of SiO$_2$ or the like and a deposited film 2 including Boron B is formed with plasma to both side walls of the silicon Fin part 11 in the state where the hard mask 12 used in the etching process is remained at an upper end of the silicon Fin part 11. In this process, although the deposited film 2 is formed onto the insulation layer 16 that is the insulation film, the deposited film 2 formed onto the insulation layer 16 is removed later.

Next, by obliquely irradiating an ion beam 5 from an upper left direction (diagonal upper direction) of the silicon Fin part 11, a heavy ion such as Ge, Xe or the like is implanted. As result, by a knock on effect (or action) which will be described later, electro-active impurity in silicon, which are present in the deposited film 2 is implanted into a left side wall of the silicon Fin part 11 (FIG. 3A). Subsequently, by obliquely irradiating the ion beam 5 from an upper right direction (diagonal upper direction) of the silicon Fin part 11, a heavy ion such as Ge, Xe or the like is implanted. As a result, electro-active impurity in silicon, which are present in the deposited film 2 is implanted into a right side wall of the silicon Fin part 11 (FIG. 3B). Thus, an impurity diffusion layer 3 is formed in the both side walls of the silicon Fin part 11 (FIG. 3C). Then, the deposited film 2 is removed (FIG. 3D). In the example, an incidence angle (an angle to a vertical line) of the ion beam 5 to the side wall of the silicon Fin part 11 is within 20° and approximately 10° is preferable.

In the Fin type FET manufactured with the above-mentioned method, an upper portion of the silicon Fin part 11 is never utilized as a channel region of a transistor. However, if the upper portion of the silicon Fin part 11 can be utilized as a channel region of a transistor, it is possible to reduce a height of the silicon Fin part 11 and to increase a Fin width (a size of horizontal direction in FIGS. 3A to 3D) of the silicon Fin part 11. This is advantageous in manufacturing the Fin type FET. Further, it can bring an increase in drive current and the characteristic of the transistor can be improved. Such a Fin type FET is called a TriFET. In this case, it is required to implant the impurity into upper side walls of the silicon Fin part 11, that is an upper flat portion of the silicon Fin part 11, in the same concentration level as the side walls lower than the upper flat portion.

However, in the above method proposed by the present inventors, the impurity implantation to the upper flat portion of the silicon Fin part is never considered. For this reason, it is impossible to effectively utilize the upper portion of the silicon Fin part and therefore the Fin type FET has degraded drive current.

SUMMARY OF INVENTION

An object of the present invention is to improve a doping method of an impurity atom to side wall portions and an upper flat portion of a cubic concavity and convexity part of a three-dimensional device.

A specific object of the present invention is to provide a method for performing impurity diffusion to a three-dimension device, for example, an upper flat portion of a silicon Fin part, in the same concentration as side wall portions of the silicon Fin part.

In a semiconductor device manufacturing method according to the present invention, a cubic concavity and convexity part is formed with an etching process or the like onto a semiconductor substrate which is a base substrate of the semiconductor device. A thin film including an impurity atom which can become a carrier impurity atom serving as a donor or an acceptor in the semiconductor substrate is formed, as a deposited film, to the cubic concavity and convexity part so that a film thickness of the thin film formed on an upper flat portion of the cubic concavity and convexity part becomes large relative to a film thickness of the thin film formed on the surface of side wall portions of the cubic concavity and convexity part. An ion of atom (heavy atom) which is larger in atomic weight than the impurity atom which becomes an electro-carrier in the semiconductor substrate is obliquely implanted from a diagonal upper direction of the cubic concavity and convexity part to thereby implant the impurity atomic into the side walls including un upper portion of the cubic concavity and convexity part by utilizing a recoil effect according to knocking on the ion implantation. In this process, an implantation amount (dose amount) of the impurity atom is adjusted with a thickness of the thin film, i.e. the deposited film. By utilizing a phenomenon where the implantation amount of the impurity atom decreases as the thickness of the deposited film increases, the implantation amount of the side walls of the cubic concavity and convexity part is made to become equal to the implantation amount of the upper flat portion of the cubic concavity and convexity part. For this purpose, a diagonal ion implantation from a diagonal upper direction of the cubic concavity and convexity part is carried out two times from two opposite diagonal directions and then the thickness of the deposited film deposited to the upper flat portion of the cubic concavity and convexity part is selected so that the impurity atoms are implanted with knock on effect (or action) approximately half in amount relative to the side wall portion of the cubic concavity and convexity part. It is supposed that an ion implantation angle (an angle to a direction orthogonal to the upper flat portion) is, for example, 10°, an ion implantation angle (an angle to a direction orthogonal to the surface of the side wall) to the surface of the side wall of the cubic concavity and convexity part becomes equal to 80°. In this case, as will be described later in detail, since the dose amount (ion implantation amount) of the side wall of the cubic concavity and convexity part becomes a substantial dose amount of 17.6% defined by cosine 80°/cosine 10° relative to the upper surface (upper flat portion) of the cubic concavity and convexity part, the thickness of the deposited film deposited on the upper flat portion of the cubic concavity and convexity part is set to enough thickness concomitant with the above mentioned value. Generally, in the film deposition with plasma, since the coverage of the deposited film to the upper flat portion and the side walls of the cubic concavity and convexity part can be controlled, it is natural that the deposited film is formed to the upper flat portion with a thick thickness while the deposited film is formed to the side walls with a thin thickness and therefore the film formation is easy.

Aspects of the present invention are enumerated as follows.

(First Aspect)

A manufacturing method of a semiconductor device according to a first aspect of this invention comprises forming a cubic concavity and convexity part on the surface of a semiconductor substrate which is a base substrate of the semiconductor device. The cubic concavity and convexity part has side wall portions and an upper flat portion. The manufacturing method further comprises depositing on the surface of the semiconductor substrate an impurity thin film including an impurity atom which becomes a donor or an acceptor in the semiconductor substrate so that a film thickness of the impurity thin film formed on the surface of the upper flat portion becomes large relative to a film thickness of the impurity thin film formed on the surface of the side wall portions. The manufacturing method still further comprises performing a first diagonal ion implantation from a diagonal upper direction to the impurity thin film deposited on the cubic concavity and convexity part and subsequently a second diagonal ion implantation from an opposite diagonal upper direction to the impurity thin film deposited on the cubic concavity and convexity part and recoiling the impurity atom from the inside of the impurity thin film to the inside of the side wall portions and the inside of the upper flat portion of the cubic concavity and convexity part by performing the first and second diagonal ion implantations. It is important that an impurity amount implanted to the side wall portion is substantially a half of an impurity amount implanted to the upper flat surface in a single ion implantation. By the first and second diagonal ion implantations from diagonal upper left and right directions, the impurity is implanted into the side wall portion and the upper flat portion with the same amount (Second Aspect)

In the manufacturing method according to the first aspect, a ratio of impurity implantations to the side wall portion and the upper flat portion is adjusted by adjusting a ratio of a deposition thickness of the impurity thin film deposited to the side wall portion and a deposition thickness of the impurity thin film deposited to the upper flat portion.

(Third Aspect)

In the manufacturing method according to the first aspect, a ratio of impurity implantations to the side wall portion and the upper flat portion is adjusted by adjusting an ion implantation angle of the first and second diagonal ion implantations.

(Fourth Aspect)

In the manufacturing method according to the first aspect, a ratio of impurity implantations to the side wall portion and the upper flat portion is adjusted by adjusting a ratio of a deposition thickness of the impurity thin film deposited to the side wall portion and a deposition thickness of the impurity thin film deposited to the upper flat portion and by adjusting an ion implantation angle of the first and second diagonal ion implantations.

(Fifth Aspect)

In the manufacturing method according to the first aspect, an impurity is implanted into the side wall portion and the upper flat portion at a ratio of substantially 2:1 in amount by adjusting a ratio of a deposition thickness of the impurity thin film deposited to the side wall portions and a deposition thickness of the impurity thin film deposited to the upper flat portion and by adjusting an ion implantation angle of the first and second diagonal ion implantations.

(Sixth Aspect)

In the manufacturing method according to the fifth aspect, by performing the first diagonal ion implantation from the diagonal upper direction and the second diagonal ion implantation from the opposite diagonal upper direction, the impurity is implanted into the side wall portion and the upper flat portion with the same amount.

(Seventh Aspect)

In the manufacturing method according to any one of the third through fifth aspects, a ratio of a deposition thickness of the impurity thin film deposited to the side wall portions and a deposition thickness of the impurity thin film deposited to the upper flat portion a ratio of deposited film is set so that the deposition thickness of the impurity thin film deposited to the upper flat portion is twice or more the deposition thickness of the impurity thin film deposited to the side wall portion.

(Eighth Aspect)

In the manufacturing method according to the first aspect, a recoil condition and a dose atomic weight corresponding to an implantation dose amount are controlled by an adjustment of a deposition thickness of the impurity thin film deposited to the side wall portion and a deposition thickness of the impurity thin film deposited to the upper flat portion, an adjustment of a species of an impurity deposition material of the impurity thin film, or an adjustment of an implantation ion species, an ion implantation angle, an implantation energy, and an implantation dose amount.

(Ninth Aspect)

In the manufacturing method according to the first aspect, the impurity atom of the impurity thin film is any one of B, P, and As.

(Tenth Aspect)

In the manufacturing method according to the first aspect, as the impurity thin film, the impurity thin film including B is deposited by performing a plasma treatment with a gas including diborane $B_2H_6$ or $BF_3$.

(Eleventh Aspect)

In the manufacturing method according to the first aspect, as the impurity thin film, the impurity thin film including P is deposited by performing a plasma treatment with a gas including phosphine $PH_3$.

(Twelfth Aspect)

In the manufacturing method according to the first aspect, as the impurity thin film, the impurity thin film including As is deposited by performing a plasma treatment with a gas including arsine $AsH_3$.

(Thirteenth Aspect)

In the manufacturing method according to the first aspect, an implantation ion in the first and second diagonal ion implantations is the ion of a heavy atom which is larger in atomic weight than any one of B, P, and As which constitute the impurity atom of the impurity thin film.

(Fourteenth Aspect)

In the manufacturing method according to the first aspect, an implantation ion in the first and second diagonal ion implantations is any one of Si, As, Ge, In, Sb, Xe, and Ar.

(Fifteenth Aspect)

In the manufacturing method according to the eighth aspect, a beam incidence angle to the surface of the cubic concavity and convexity part from the diagonal upper direction in the ion implantation is an inclination angle substantially less than 20 degrees.

(Sixteenth Aspect)

In the manufacturing method according to the first aspect, the impurity atom in the impurity thin film is recoiled from the inside of the impurity thin film to the inside of the semiconductor substrate by a knock on effect that is caused, at a surface part of the cubic concavity and convexity part, by collision of the implantation ion to the impurity atom in the impurity thin film in a direction substantially orthogonal to the surface part.

(Seventeenth Aspect)

In the manufacturing method according to the eighth aspect, the first and second diagonal ion implantations are performed with low-energy implantation less than 5 keV.

(Eighteenth Aspect)

In the manufacturing method according to the eighth aspect, the first and second diagonal ion implantations are performed with low dose implantation atomic weight less than 2E15 atoms/cm$^2$.

(Nineteenth Aspect)

In the manufacturing method according to the first aspect, the impurity thin film is thickly deposited on a plane part of the surface of the semiconductor substrate except for the cubic concavity and convexity part.

(Twentieth Aspect)

In the manufacturing method according to any one of the tenth through twelfth aspects, the impurity thin film is thickly deposited on a plane part of the semiconductor substrate except for the cubic concavity and convexity part by increasing a deposition rate of the impurity thin film deposited on the plane part with the plasma treatment while by decreasing, relative to that for the plane part, a deposition rate of the impurity thin film deposited on the side walls of the cubic concavity and convexity part.

According to the present invention, it is possible to dope the impurity with the same amount into the side wall portion and the upper flat portion of the cubic concavity and convexity part formed on the surface of the semiconductor substrate. As a result, it is possible to effectively utilize the upper flat portion of the cubic concavity and convexity part.

BRIEF DESCRIPTION OF THE DRAWINGS

FIGS. 3A to 3D are diagrams which show a process flow of a manufacturing method of a Fin type FET according to a proposal of the present inventors.

DESCRIPTION OF THE PREFERRED EMBODIMENTS

Figure 1A:
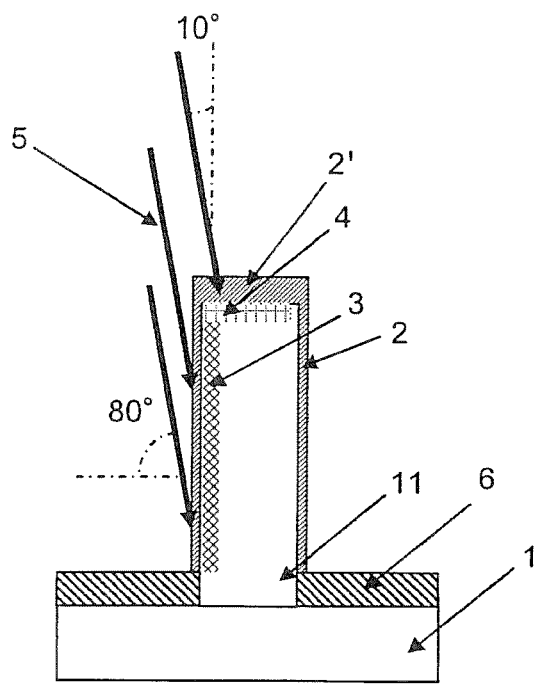
FIGS. 1A to 1C are diagrams which show an ion implantation process flow according to the embodiment of the present invention.
Figure 1B:
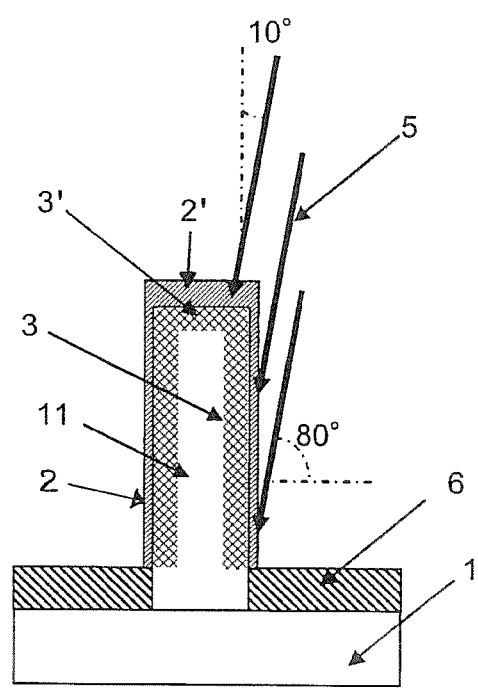
Figure 1C:
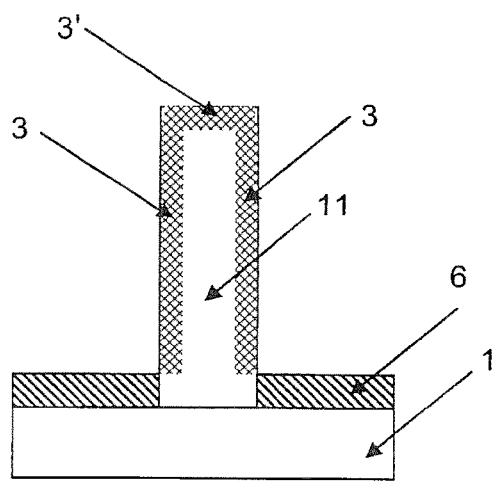

Referring to FIGS. 1A to 1C, the description will be made in regard to an ion implantation process flow according to an embodiment of the present invention. FIGS. 1A to 1C illustrate an area shown by a dashed line in FIG. 2 with a sectional view, as well as FIGS. 3A to 3D.

At first, a silicon Fin part 11 as described before is formed onto the surface of a silicon substrate 1 with an etching process or the like. Next, as shown in FIG. 1A, a plane part of the silicon substrate 1 except for the silicon Fin part 11 is covered with an insulation layer 16 that is an insulation film made of $SiO_2$ or the like. Subsequently, with the plasma treatment or the like similar to that was described in FIGS. 3A to 3D, a deposited film 2 including an impurity of P type or N type, e.g. B, is deposited to both side wall portions of the silicon Fin part 11 while a deposited film 2' larger in thickness than the deposited film 2 is deposited to an upper flat portion of the silicon Fin part 11. Then, heavy ions are implanted by obliquely irradiating an ion beam 5 of heavy ions of the impurity, i.e. Xe, Ge or the like, which is larger in mass (larger in atomic weight) than the impurity in the deposited films 2 and 2' from a left diagonal upper direction of the silicon Fin part 11. As result, by a knock on effect (or action) which will be described later, electro-active impurity in silicon, which are present in the deposited films 2 and 2' is implanted into the inside of a left side wall of the silicon Fin part 11 and the inside of the upper flat portion of the silicon Fin part 11. In this process, although an impurity diffusion layer 3 is formed inside the left side wall of the silicon Fin part 11 while an impurity diffusion layer 4 is formed inside the upper flat portion of the silicon Fin part 11, the dose amount (ion implantation amount) of the impurity diffusion layer 4 is approximately a half of that of the impurity diffusion layer 3. The reason will be described later.

Subsequently, as shown in FIG. 1B, heavy ions are implanted by obliquely irradiating an ion beam 5 of heavy ions of the impurity used in the process described in FIG. 1A, i.e. Xe, Ge or the like from a right diagonal upper direction of the silicon Fin part 11.

As result, electro-active impurity in silicon, which are present in the deposited films 2 and 2' is implanted into the inside of a right side wall of the silicon Fin part 11 and the inside of the upper flat portion of the silicon Fin part 11. In this process, an impurity diffusion layer 3 is formed inside the both side walls of the silicon Fin part 11 while an impurity diffusion layer 3' is formed inside the upper flat portion of the silicon Fin part 11.

Here, it is desirable that the impurity dose amount (dose amount of the impurity diffusion layer 3) to the both side walls of the silicon Fin part 11 with the irradiating of the ion beam 5 is equal to the impurity dose amount (dose amount of the impurity diffusion layer 3') to the upper flat portion of the silicon Fin part 11 with the irradiating of the ion beam 5. In other words, it is desirable that a ratio of an impurity amount implanted into the side wall portion of the silicon Fin part 11 in FIG. 1A or FIG. 1B and an impurity amount into the upper flat portion of the silicon Fin part 11 in FIG. 1A or FIG. 1B becomes substantially 2:1. To do that, it is desirable that an incidence angle α (an angle to a vertical line or a side wall surface of the silicon Fin part 11) of the ion beam 5 and a relation between a thickness t1 of the deposited film 2 and a thickness t2 of the deposited film 2' are set as follows.

Figure 4:
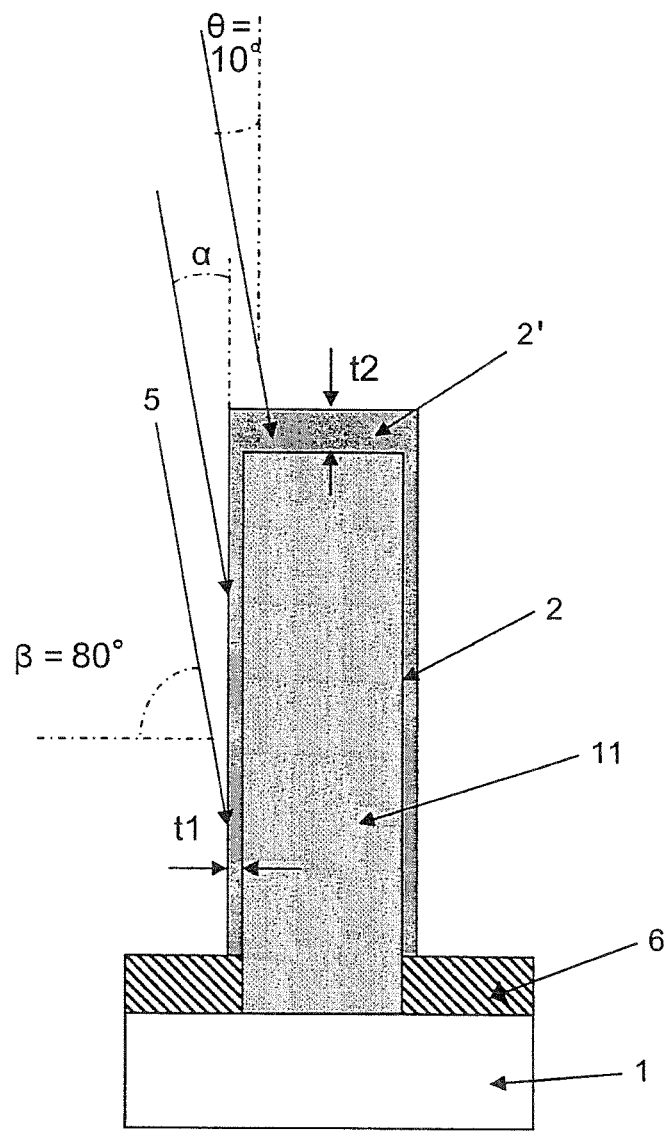
FIG. 4 is a sectional view for explaining a relation between an ion implantation angle and deposition thicknesses of impurity thin films deposited to a side wall portion and an upper flat portion of a silicon Fin part, which is for obtaining the same impurity diffusion amount.

Referring to FIG. 4, an incidence angle α (an angle that the incidence angle of the ion beam 5 forms to a vertical line) of the ion beam 5 to a side wall surface of the silicon Fin part 11 is set within 20° in each of FIGS. 1A and 1B, and it is desirable to set to approximately 10°. When the beam incidence angle α is 10°, an ion implantation angle β to the side wall surface of the silicon Fin part 11 is 80°. In this event, in comparison with an ion implantation angle θ (=10° of the upper flat portion of the silicon Fin part 11, the dose amount of the side wall of the silicon Fin part 11 is defined by cos 80°/cos 10°=0.174. That is, if the dose amount of Nd=1E14 is required for the side wall of the silicon Fin part 11, the dose amount of the upper flat portion of the silicon Fin part 11 is 5.64E14. In this case, it is possible to perform conformal doping by setting a thickness t2 of the deposited film 2' of the silicon Fin part 11 relative to a thickness t1 of the deposited film 2 to a value so that the dose amount of the upper flat portion of the silicon Fin part 11 becomes a half of that of the side wall portion of the silicon Fin part 11 and by performing ion implantation with the ion beam of the heavy ion. With respect to a ratio of the thickness of the deposited film 2 and the thickness of the deposited film 2', it is desirable that the thickness t2 of the deposited film 2' is more than twice the thickness t1 of the deposited film 2 and t2:t1=10:3 is more desirable. With respect to the heavy ion, Xe is more desirable than Ge.

Figure 5:
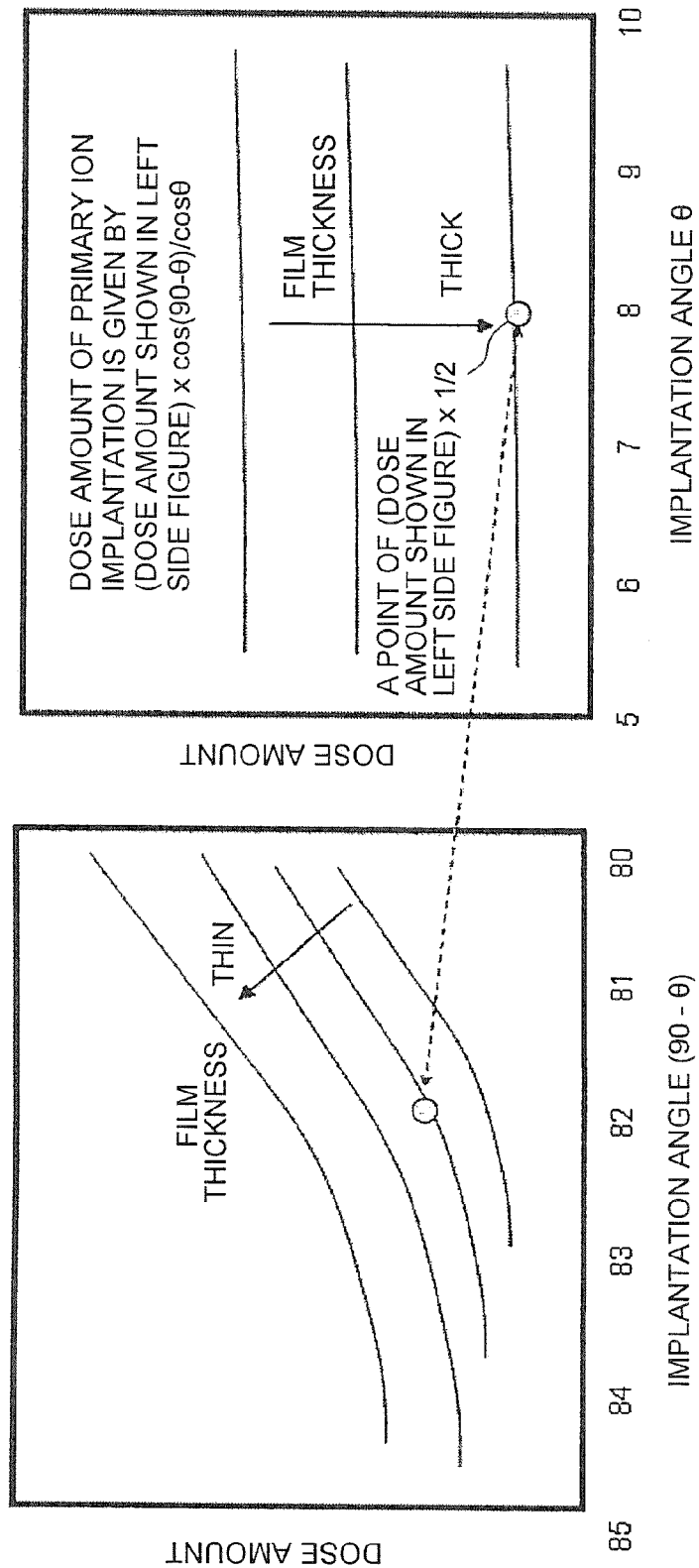
FIG. 5 is a characteristic illustration which shows a relation among an ion implantation angle, a deposition thickness of an impurity thin film, and an impurity amount implanted into silicon (semiconductor substrate).

FIG. 5 shows a relation among the ion implantation angle β (=90−θ) to the side wall portion of the silicon Fin part, the thickness of the deposited film of the side wall portion, and the impurity dose amount to the silicon substrate and a relation among the ion implantation angle θ to the upper flat portion of the silicon Fin part, the thickness of the deposited film of the upper flat portion, and the impurity dose amount to the silicon substrate.

Turning back to FIG. 1C, after completion of the process in FIG. 1B, the deposited films 2 and 2' are removed.

In the formation of the deposited film with the plasma treatment, since the plane part of the silicon substrate 1 except for the silicon Fin part 11 is covered with the insulation layer 6, a deposited film (not shown) is formed on the insulation layer 6. In this event, even if the impurity is implanted into the insulation layer 6 with the heavy ion implantation according to the ion beam irradiation, such an impurity implantation to the insulation film does not cause the problem with respect to an electrical characteristic of the device. Although the thickness of the deposited film formed on the plane part of silicon substrate 1 becomes larger than that of the deposited film formed to the side wall portion of the silicon Fin part 11, this also does not cause any problems. The above-mentioned points are applied to examples which will be described later.

Figure 6:
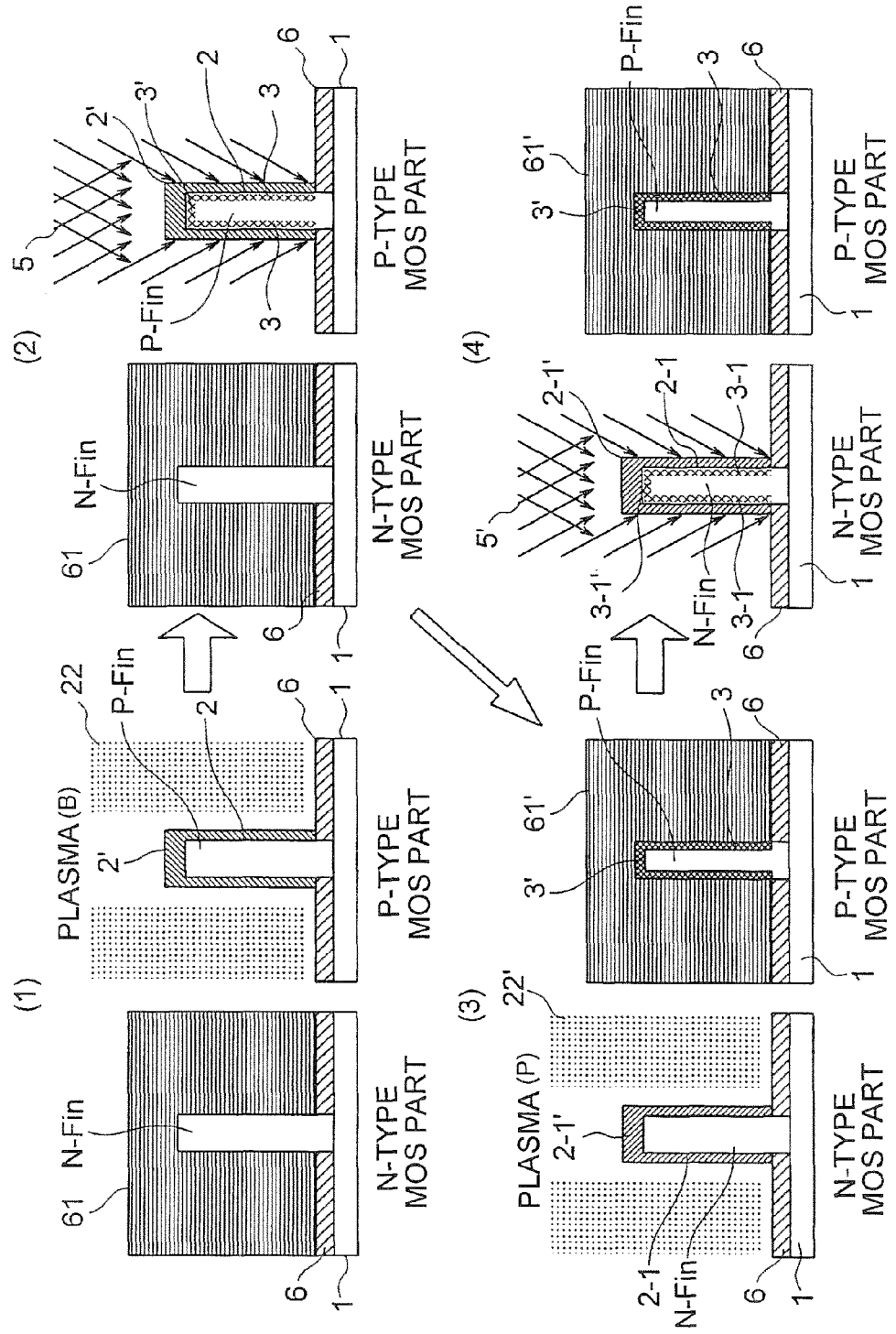
FIG. 6 is a diagram for explaining a process flow of a manufacturing method of an example in case where the present invention is applied to manufacturing of a CMOS FET.

Referring to FIG. 6, an example of the present invention will be described.

FIG. 6 shows a process flow which forms a CMOS (Complementary Metal Oxide Semiconductor) EFT. In the example, deposited films including P or B are selectively formed to an N-type device region and a P-type device region, respectively. Then, extension regions of N-type MOSFET and P-type MOSFET (which are referred to as an N-type MOS part and a N-type MOS part) are formed on the same substrate, as an N-type Fin part and a P-type Fin part, with two mask alignments.

Figure 2:
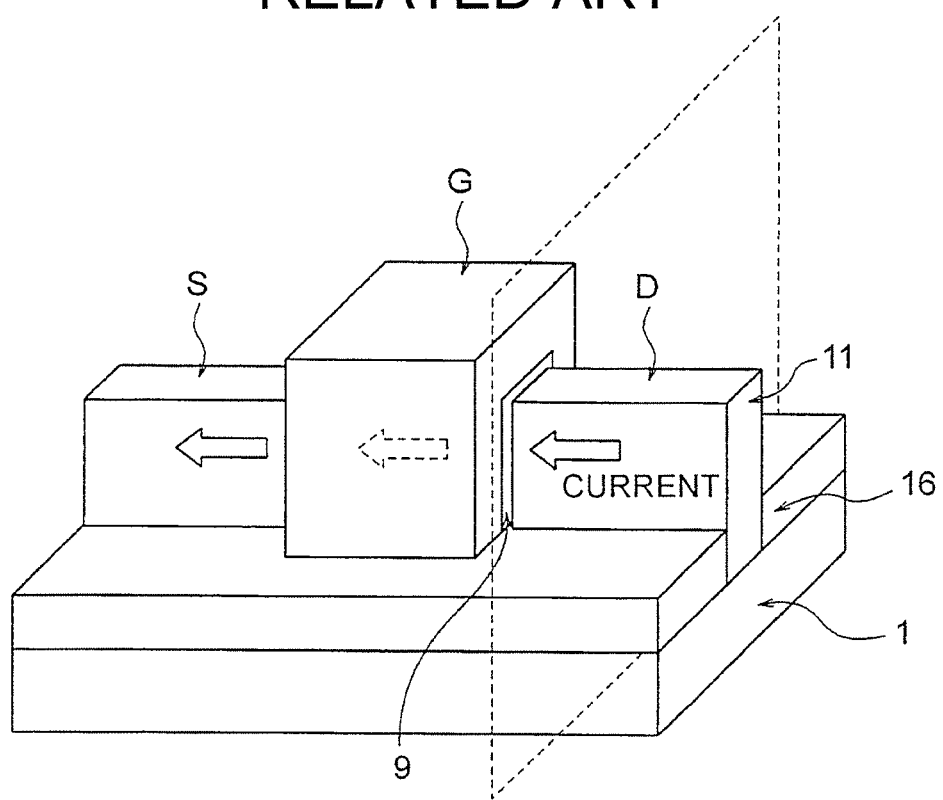
FIG. 2 is a perspective view for explaining a Fin type FET in which the present invention is applied.

For convenience, as described in FIG. 2, FIG. 6 shows a case with a sectional view, where CMOSFETs each of which is comprised of a drain Fin part (a part shown by D in FIG. 2), a channel Fin part (an inside part of a part shown by G in FIG. 2), and a source Fin part (a part shown by S in FIG. 2) are formed, as the N-type MOS part and the P-type MOS part, respectively, to Fin-shaped silicon Fin parts which are formed to a silicon substrate 1 with the etching process or the like. In particular, FIG. 6 shows a Fin part which is one of a source and a drain of the N-type MOS part or P-type MOS part and a Fin part which is another one of a source and a drain of the N-type MOS part or P-type MOS part.

In a process (1) (left upper drawing) of FIG. 6, a plane part of a silicon substrate 1 except for the surface of a P-Fin part (P-Fin) which becomes the P-type MOS part and the surface of an N-Fin part (N-Fin) which becomes the N-type MOS part is previously covered with an insulation layer 6. Subsequently, with the state that the N-Fin part (N-Fin) which is one of the P-Fin and N-Fin parts and which becomes the N-type MOS part is covered with a resist 61, deposited films 2 and 2' including B (Boron) are formed, as in the case of FIG. 1A, to the surface (side wall portions and upper flat portion) of the P-Fin part (P-Fin) which is another one of the P-Fin and N-Fin parts and which becomes the P-type MOS part with plasma 22.

Next, in a process (2) (right upper drawing in FIG. 6), with the state that the N-Fin part (N-Fin) which becomes the N-type MOS part is covered with the resist 61, heavy ions are implanted into the P-Fin part of the P-type MOS part by irradiating an ion beam 5 of Xe (or Ge) from a diagonal direction of upper right (or upper left) and from a diagonal direction of upper left (or upper right) in order.

In a process (3) (left under drawing in FIG. 6), at first, the resist 61 of the N-type MOS part is removed and simultaneously the deposited films 2 and 2' of the P-type MOS part are removed. After this, with the state that the P-Fin part which becomes the P-type MOS part is covered with the resist 61', deposited films 2-1 and 2-1' including P (Phosphorus) are formed, as in the case of FIG. 1A, to the surface (side wall portions and upper flat portion) of the N-Fin part (N-Fin) which becomes the N-type MOS part with plasma 22.

Next, in a process (4) (right under drawing in FIG. 6), with the state that the P-Fin part which becomes the P-type MOS part is covered with a resist 61', heavy ions are implanted into the N-Fin part of the N-type MOS part by irradiating an ion beam 5' of Xe (or Ge) from a diagonal direction of upper right (or upper left) and from a diagonal direction of upper left (or upper right) in order. After this, the deposited films 2-1 and 2-1' of the N-type MOS part are removed together with the removal of the resist 61'.

With the manner described above, two sets of source-drain are formed by forming the N-type MOS part having impurity diffusion layers 3-1 and 3-1' formed to the side wall portions and the upper flat portion, respectively, of the N-Fin part (N-Fin) with a uniform dose amount and forming the P-type MOS part having impurity diffusion layers 3 and 3' formed to the side wall portions and the upper flat portion, respectively, of the P-Fin part (P-Fin) with a uniform dose amount.

Figure 7:
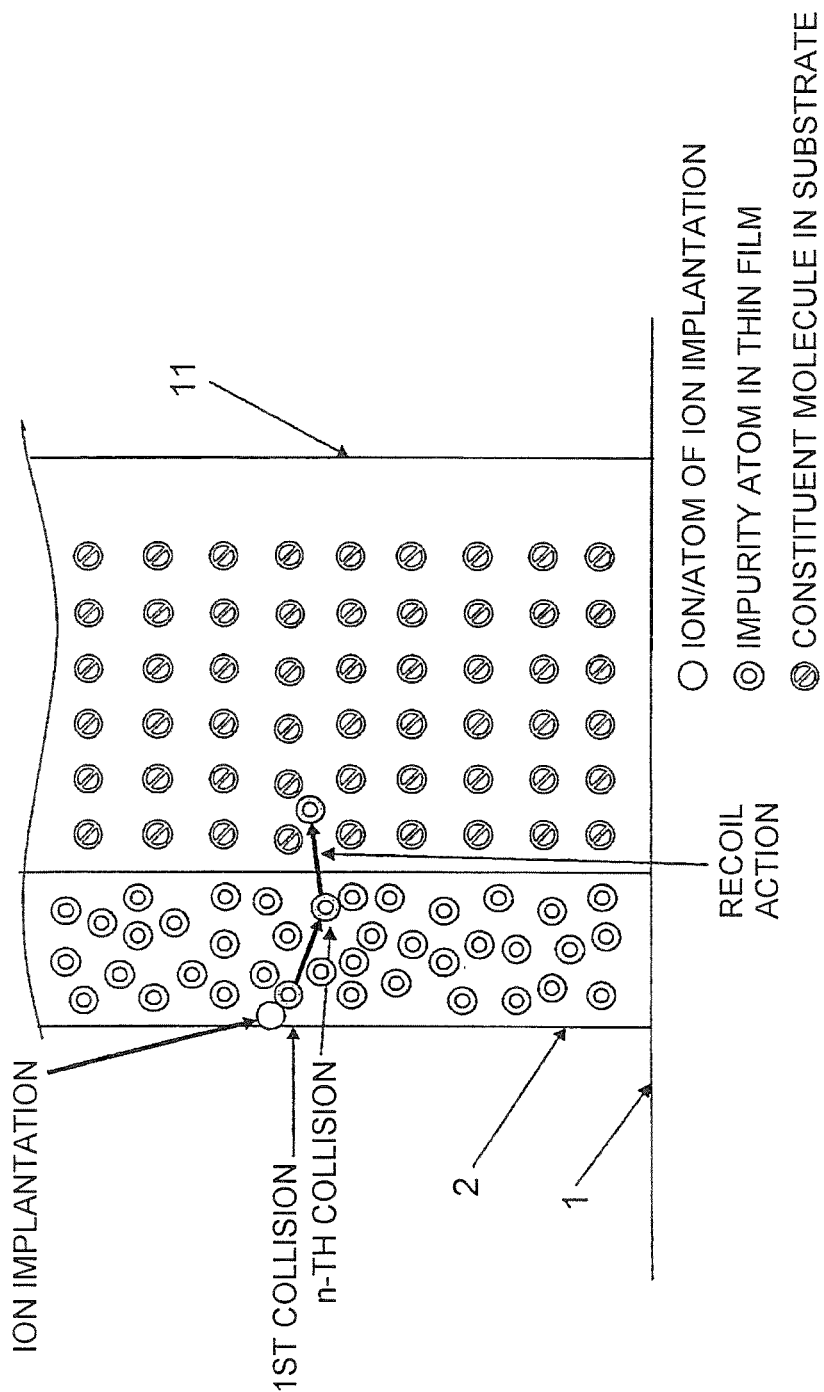
FIG. 7 is a sectional view for explaining a recoil action according to an ion implantation of the present invention.
Figure 8:
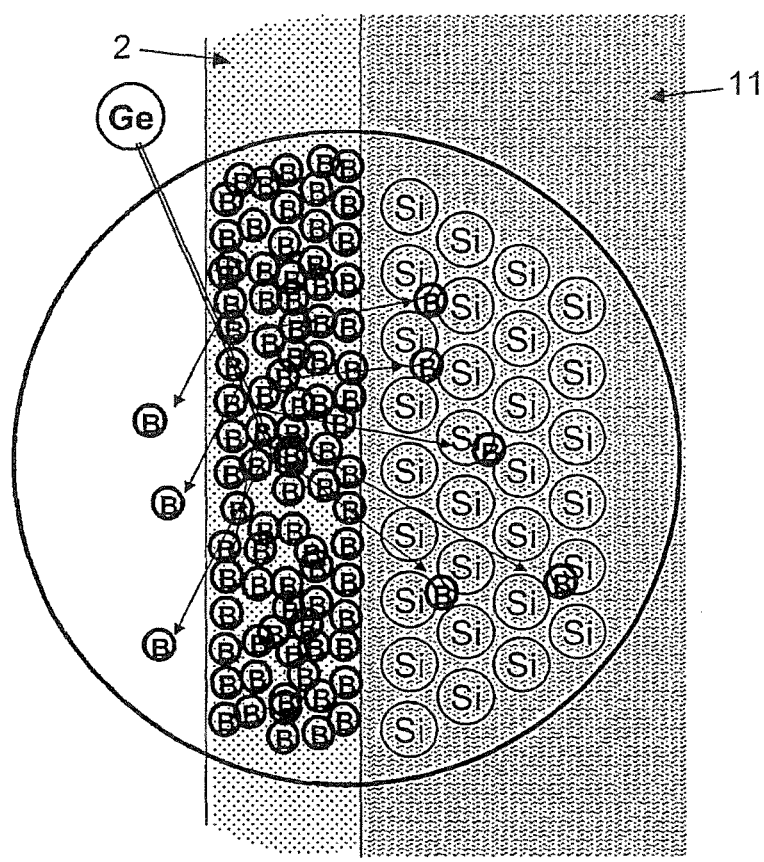
FIG. 8 is an enlarged sectional view which shows the recoil action of FIG. 7.

FIGS. 7 and 8 are diagrams for explaining the recoil action according to the embodiment of this invention. Herein, although the description will be made with respect to a case of the upper right process (2) in FIG. 6, FIGS. 7 and 8 show only the part necessary for the explanation.

In FIG. 7, with the ion beam irradiation to the silicon Fin part from a diagonal direction of upper left, the impurity atom B in the deposited film 2 that is formed to the surface part of the silicon Fin part 11 is recoiled from the inside of the deposited film 2 to the inside of the silicon Fin part 11 by a knock on effect that is caused by collision of the implantation ion to the impurity atom B in the deposited film 2 in a direction substantially orthogonal to the surface of the side wall of the silicon Fin part (substantially perpendicular direction).

In general, when particles (atom/ion) accelerated at high speed are implanted into the substance of a solid or liquid material, the energy of the particles decreases gradually as the particles colliding with atoms constituting the material. Finally, the particles stop, when the energy of the implantation particles decreases to the energy that is smaller than the potential energy that the material produces. In this time duration, in an energy range utilized in a usual ion implantation, several dozen to several thousand atoms in the material are received with the energy.

FIG. 7 shows a movement of one colliding-particle to make it easy to understand the recoil action based on the principle mentioned above. However, in reality, as shown in FIG. 8 with an enlarged diagram, multiple and multistage collisions (first through n-th collision) are occurred in the inside of the deposited film 2.

Especially, when the mass of the colliding-particle is heavier in weight than that of the atom constituting the material of the deposited film, it is possible to give the energy to the more atoms constituting the material. In this case, quite a number of purpose impurity atoms more than the incident particles can be implanted (introduced) within the semiconductor substrate. Furthermore, since the energy of the implantation ion can be set higher than the energy given to the purpose impurity atoms, the space-charge effect is suppressed lower than a case of the direct implantation, and it is possible to set the high beam current.

(Effect of the Embodiment)

According to the embodiments of the present invention, by the formation of the deposited thin film with the plasma and by the recoil action (knock on effect) caused by the ion implantation, it is possible to uniformly implant the impurity into all the side wall portions and the upper flat portion of the cubic three-dimension device. As a result, it is possible to effectively utilize the upper portion of the silicon Fin part.

While the present invention has been particularly shown and described with reference to exemplary embodiments thereof, the present invention is not limited to these embodiments. It will be understood by those of ordinary skill in the art that various changes in form and details may be made therein without departing from the sprit and scope of the present invention as defined by the claims.

For example, the solid material which becomes the base substrate of the semiconductor device is a solid silicon (silicon: single crystal or polycrystalline), GaAs, Ge, SiC, a compound semiconductor or the like.

In addition, it is desirable that a recoil condition, namely, the energy (depth profile corresponding to an implantation depth) for the ion implantation of the impurities of the impurity thin film or a dose atomic weight corresponding to an implantation dose amount is controlled by an adjustment of a film thickness of the impurity thin film (deposited film) or a species of an impurity deposition material of the impurity thin film, or an adjustment of an implantation ion species, an implantation angle, an implantation energy, and an implantation dose amount.

In this case, it is desirable that a condition of non-implantation is adjusted by adjusting a film thickness of the impurity thin film, a species of the impurity deposition material, an implantation ion species, an implantation angle, an implantation energy, and an implantation dose amount so that the implantation ion itself remains in the impurity thin film without being almost introduced into a concavity and convexity part formed by the processing of the semiconductor substrate.

For the impurity atom of the impurity thin film, As may be used other than B and P.

As a gas which is used to deposit the impurity thin film including B with the plasma treatment, a gas including $BF_3$ may be used in place of diborane $B_2H_6$.

On the other hand, there is a gas including phosphine $PH_3$ as a favorable example of the gas which is used to deposit the impurity thin film including P with the plasma treatment.

In addition, there is a gas including arsine $AsH_3$ as a favorable example of the gas which is used to deposit the impurity thin film including As with the plasma treatment.

For the implantation ion in the ion implantation process, it can use any one of Si, As, Ge, In, Sb, Xe, and Ar.

In addition, the following process may be adopted. After the formation of a deposited film including B to the semiconductor substrate with a plasma treatment by the use of $B_2H_6$, covers the whole of the surface of the semiconductor substrate with a resist protective film and then removes the resist protective film selectively so as to expose a part of the surface of the semiconductor substrate wherein the resist protective film was removed. Subsequently, removes the deposited film including B of a part corresponding to an exposed part and then forms a deposited film including P to a removed part with a plasma treatment by the use of $PH_3$. After removing the whole of the resist protective film, any one ion of Ge, Si, As, In, Sb, Xe, and Ar is implanted to the whole of the surface of the semiconductor substrate.

What is claimed is:

1. A manufacturing method of a semiconductor device, comprising:

forming a cubic concavity and convexity part on the surface of a semiconductor substrate which is a base substrate of the semiconductor device, said cubic concavity and convexity part having side wall portions and an upper flat portion;

depositing on the surface of said semiconductor substrate an impurity thin film including an impurity atom which becomes a donor or an acceptor in the semiconductor substrate so that a film thickness of the impurity thin film formed on the surface of said upper flat portion becomes large relative to a film thickness of the impurity thin film formed on the surface of said side wall portions;

performing a first diagonal ion implantation from a diagonal upper direction to the impurity thin film deposited on the cubic concavity and convexity part of said semiconductor substrate and subsequently a second diagonal ion implantation from an opposite diagonal upper direction to the impurity thin film deposited on the cubic concavity and convexity part of said semiconductor substrate; and recoiling the impurity atom from the inside of the impurity thin film to the inside of the side wall portions and the inside of the upper flat portion of said cubic concavity and convexity part of said semiconductor substrate by performing the first and second diagonal ion implantations, wherein the impurity atom in said impurity thin film is recoiled from the inside of said impurity thin film to the inside of said semiconductor substrate by a knock on effect that is caused, at a surface part of the cubic concavity and convexity part of said semiconductor substrate, by a collision of the implantation ion to the impurity atom in said impurity thin film in a direction substantially orthogonal to the surface part, wherein the impurity thin film is thickly deposited on a plane part of the surface except for the cubic concavity and convexity part of said semiconductor substrate, wherein an implantation ion in the first and second diagonal ion implantations is the ion of a heavy atom which is larger in atomic weight than the impurity atom of said impurity thin film, the implantation ion in the first and second diagonal ion implantations is any one of Si, As, Ge, In, and Sb, and the impurity atom of said impurity thin film is any one of B, P, and As.

2. The manufacturing method according to claim 1, wherein a ratio of impurity implantations to the side wall portion and the upper flat portion is adjusted by adjusting a ratio of a deposition thickness of the impurity thin film deposited to the side wall portion and a deposition thickness of the impurity thin film deposited to the upper flat portion.

3. The manufacturing method according to claim 1, wherein a ratio of impurity implantations to the side wall portion and the upper flat portion is adjusted by adjusting an ion implantation angle of said first and second diagonal ion implantations.

4. The manufacturing method according to claim 3, wherein a ratio of a deposition thickness of the impurity thin film deposited to the side wall portions and a deposition thickness of the impurity thin film deposited to the upper flat portion a ratio of deposited film is set so that the deposition thickness of the impurity thin film deposited to the upper flat portion is twice or more the deposition thickness of the impurity thin film deposited to the side wall portion.

5. The manufacturing method according to claim 1, wherein a ratio of impurity implantations to the side wall portion and the upper flat portion is adjusted by adjusting a ratio of a deposition thickness of the impurity thin film deposited to the side wall portion and a deposition thickness of the impurity thin film deposited to the upper flat portion and by adjusting an ion implantation angle of said first and second diagonal ion implantations.

6. The manufacturing method according to claim 1, wherein an impurity is implanted into the side wall portion and the upper flat portion at a ratio of substantially 2:1 in amount by adjusting a ratio of a deposition thickness of the impurity thin film deposited to the side wall portions and a deposition thickness of the impurity thin film deposited to the upper flat portion and by adjusting an ion implantation angle of said first and second diagonal ion implantations.

7. The manufacturing method according to claim 6, wherein, by performing the first diagonal ion implantation from the diagonal upper direction and the second diagonal ion implantation from the opposite diagonal upper direction, the impurity is implanted into the side wall portion and the upper flat portion with the same amount.

8. The manufacturing method according to claim 1, wherein a recoil condition and a dose atomic weight corresponding to an implantation dose amount are controlled by an adjustment of a deposition thickness of the impurity thin film deposited to the side wall portion and a deposition thickness of the impurity thin film deposited to the upper flat portion, an adjustment of a species of an impurity deposition material of the impurity thin film, or an adjustment of an implantation ion species, an ion implantation angle, an implantation energy, and an implantation dose amount.

9. The manufacturing method according to claim 8, wherein a beam incidence angle to the surface of the cubic concavity and convexity part of said semiconductor substrate from the diagonal upper direction in said first and second diagonal ion implantations is an inclination angle substantially less than 20 degrees.

10. The manufacturing method according to claim 8, wherein said first and second diagonal ion implantations are performed with low-energy implantation less than 5 keV.

11. The manufacturing method according to claim 8, wherein said first and second diagonal ion implantations are performed with low dose implantation atomic weight less than 2E15 atoms/cm$^2$.

12. The manufacturing method according to claim 1, wherein, as said impurity thin film, the impurity thin film including B is deposited by performing a plasma treatment with a gas including diborane $B_2H_6$ or $BF_3$.

13. The manufacturing method according to claim 12, wherein the impurity thin film is thickly deposited on a plane part of the semiconductor substrate except for the cubic concavity and convexity part of said semiconductor substrate by increasing a deposition rate of the impurity thin film deposited on said plane part with said plasma treatment while by decreasing, relative to that for the plane part, a deposition rate of the impurity thin film deposited on the side walls of said cubic concavity and convexity part of said semiconductor substrate.

14. The manufacturing method according to claim 1, wherein, as said impurity thin film, the impurity thin film including P is deposited by performing a plasma treatment with a gas including phosphine $PH_3$.

15. The manufacturing method according to claim 1, wherein, as said impurity thin film, the impurity thin film including As is deposited by performing a plasma treatment with a gas including arsine $AsH_3$.

16. The manufacturing method according to claim 1, wherein a plane part of the surface of said semiconductor substrate except for the side wall portion and the upper flat portion is covered with an insulation layer.

* * * * *